(12) United States Patent
Shan et al.

(10) Patent No.: US 11,062,976 B2
(45) Date of Patent: Jul. 13, 2021

(54) FUNCTIONAL STIFFENER THAT ENABLES LAND GRID ARRAY INTERCONNECTIONS AND POWER DECOUPLING

(71) Applicant: International Business Machines Corporation, Armonk, NY (US)

(72) Inventors: Lei Shan, Carmel, NY (US); Daniel J. Friedman, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 16/402,986

(22) Filed: May 3, 2019

(65) Prior Publication Data

US 2020/0350234 A1 Nov. 5, 2020

(51) Int. Cl.
| | |
|---|---|
| *H01L 23/48* | (2006.01) |
| *H01L 23/00* | (2006.01) |
| *H01L 23/522* | (2006.01) |
| *H01L 21/768* | (2006.01) |
| *H05K 1/11* | (2006.01) |
| *H01G 4/12* | (2006.01) |

(52) U.S. Cl.
CPC ...... *H01L 23/481* (2013.01); *H01L 21/76898* (2013.01); *H01L 23/5222* (2013.01); *H01L 23/5226* (2013.01); *H01L 24/17* (2013.01); *H01L 24/32* (2013.01); *H05K 1/115* (2013.01); *H01G 4/1227* (2013.01); *H01L 2224/73253* (2013.01); *H01L 2924/1205* (2013.01); *H01L 2924/15313* (2013.01); *H05K 2201/10719* (2013.01)

(58) Field of Classification Search
CPC combination set(s) only.
See application file for complete search history.

(56) References Cited

U.S. PATENT DOCUMENTS

| | | | |
|---|---|---|---|
| 8,264,846 B2 | 9/2012 | Jones et al. | |
| 2002/0135065 A1* | 9/2002 | Zhao | H01L 23/3677 257/738 |
| 2008/0001241 A1* | 1/2008 | Tuckerman | H01L 31/0203 257/434 |
| 2011/0266671 A1* | 11/2011 | Youm | H01L 23/49827 257/738 |
| 2012/0089180 A1* | 4/2012 | Fathi | B32B 37/1284 606/214 |

(Continued)

*Primary Examiner* — Nduka E Ojeh
(74) *Attorney, Agent, or Firm* — Daniel Morris; Otterstedt, Wallace & Kammer, LLP

(57) ABSTRACT

An exemplary assembly includes a top circuit substrate; a bottom circuit assembly that underlays the top circuit substrate and is attached to the top circuit substrate by an adhesive layer as a stiffener, the adhesive layer, and a plurality of conductive balls. The top circuit substrate includes a plurality of upper vias that extend through the top circuit substrate. The bottom circuit assembly includes a plurality of lower vias that extend through the bottom circuit assembly. The adhesive layer includes internal connections that electrically connect the upper vias to the lower vias. The conductive balls are housed in the lower vias. The bottom circuit assembly has an elastic modulus at least six times the elastic modulus of the top circuit substrate, and has a coefficient of thermal expansion at least two times the coefficient of thermal expansion of the top circuit substrate.

17 Claims, 6 Drawing Sheets

(56) References Cited

U.S. PATENT DOCUMENTS

| | | |
|---|---|---|
| 2015/0162134 A1 | 6/2015 | Lee et al. |
| 2017/0207160 A1* | 7/2017 | Gowda .................. H01L 25/16 |
| 2017/0245375 A1 | 8/2017 | Lee et al. |
| 2018/0204793 A1 | 7/2018 | Minegishi |
| 2018/0277492 A1* | 9/2018 | Li ..................... H01L 23/49894 |
| 2019/0235308 A1* | 8/2019 | Song .................... G02B 5/3016 |
| 2019/0237371 A1* | 8/2019 | Ahmad ............. H01L 23/49838 |
| 2019/0259625 A1* | 8/2019 | Nemani ............ H01L 21/02129 |

* cited by examiner

FUNCTIONAL STIFFENER THAT ENABLES LAND GRID ARRAY INTERCONNECTIONS AND POWER DECOUPLING

BACKGROUND

The present invention relates to the electrical, electronic, and computer arts, and more specifically, to electronic packaging of silicon chips.

Heterogeneous integration of components in semiconductor devices continues to drive increases in the area of laminate circuit substrates. Meanwhile, circuit substrates have been decreasing in thickness as high-density wiring needs to be implemented on thin film build-up layers. Thin substrates having large areas tend to deform during manufacturing and assembling processes. Therefore, stiffeners are often applied to achieve the flatness specifications. Conventional stiffeners are metallic. Stacking two substrates while maintaining mechanical integrity and quality electrical contacts has been a challenge in electronic packaging.

SUMMARY

Principles of the invention provide techniques for a functional stiffener that enables land grid array interconnections and power decoupling. In one aspect, an exemplary assembly includes a top circuit substrate; an adhesive layer that underlays the top circuit substrate; and a bottom circuit assembly that underlays the adhesive layer and is attached to the top circuit substrate by the adhesive layer as a stiffener.

According to another aspect, an exemplary method for forming a circuit assembly includes obtaining a top circuit substrate with preformed upper vias, obtaining a bottom circuit assembly with preformed lower vias, joining the top circuit substrate to the bottom circuit assembly with the upper vias aligned to the lower vias, using an adhesive layer, and solidifying the adhesive layer using heat and pressure. In another aspect, an exemplary assembly includes a top circuit substrate; a bottom circuit assembly that underlays the top circuit substrate and is attached to the top circuit substrate by an adhesive layer as a stiffener, the adhesive layer, and a plurality of conductive balls. The top circuit substrate includes a plurality of upper vias that extend through the top circuit substrate. The bottom circuit assembly includes a plurality of lower vias that extend through the bottom circuit assembly. The adhesive layer includes internal connections that electrically connect the upper vias to the lower vias. The conductive balls are housed in the lower vias. The bottom circuit assembly has an elastic modulus at least six times the elastic modulus of the top circuit substrate, and has a coefficient of thermal expansion at least two times the coefficient of thermal expansion of the top circuit substrate.

In view of the foregoing, techniques of the present invention can provide substantial beneficial technical effects. For example, one or more embodiments provide one or more of:

A power-decoupling stiffener for a circuit substrate.

Electrical and mechanical connection of a circuit assembly to a printed circuit board, similar to an LGA (land grid array) assembly, without the expense and complexity associated with LGA fixturing.

These and other features and advantages of the present invention will become apparent from the following detailed description of illustrative embodiments thereof, which is to be read in connection with the accompanying drawings.

DETAILED DESCRIPTION

Conventional metallic stiffeners are typically nonfunctional, and sometimes may even have negative effects on signal and power integrity, as metals may induce undesired resonances and cross-talk. In one or more embodiments of the present invention, a ceramic bottom circuit assembly is used as a stiffener under a top circuit substrate. In one or more embodiments, the elastic modulus of the bottom circuit assembly exceeds that of the top circuit substrate by at least 2 times (aluminum oxide vs. BT+20% copper) and exceeds that of an organic substrate by at least 2 times, with coefficient of thermal expansion (CTE) at least 1.5 times lower than an organic substrate such as PPGA (plastic pin grid array) or FCPGA (flip chip plastic grid array), which better matches with silicon chips and benefits the reliability of the assembly. It should be understood that values of the elastic modulus and CTE described herein are exemplary and non-limiting.

Besides commonly used aluminum oxide, high dielectric constant ceramic materials (dielectric constant ranging from about 1,000 to 10,000), such as barium strontium titanate, can be incorporated to obtain a large value of capacitance in the stiffener (e.g., greater than about 1 $\mu F/cm^2$/layer), for decoupling the power delivery network of the top circuit substrate from the bottom circuit assembly and from an underlying printed circuit board. (It should be understood that the units for capacitance are given as microfarads ($\mu F$) per centimeter squared per layer.) In addition, unique recessed structures at the bottom of the bottom circuit assembly can allow direct interconnects from the top circuit substrate to the printed circuit board by inserting conductive balls into the recessed structures (vias). The result is an LGA-like mechanism without an LGA connector that is typically expensive and complex (e.g., requiring a socket for connection to a printed circuit board (PCB)).

Figure 1:
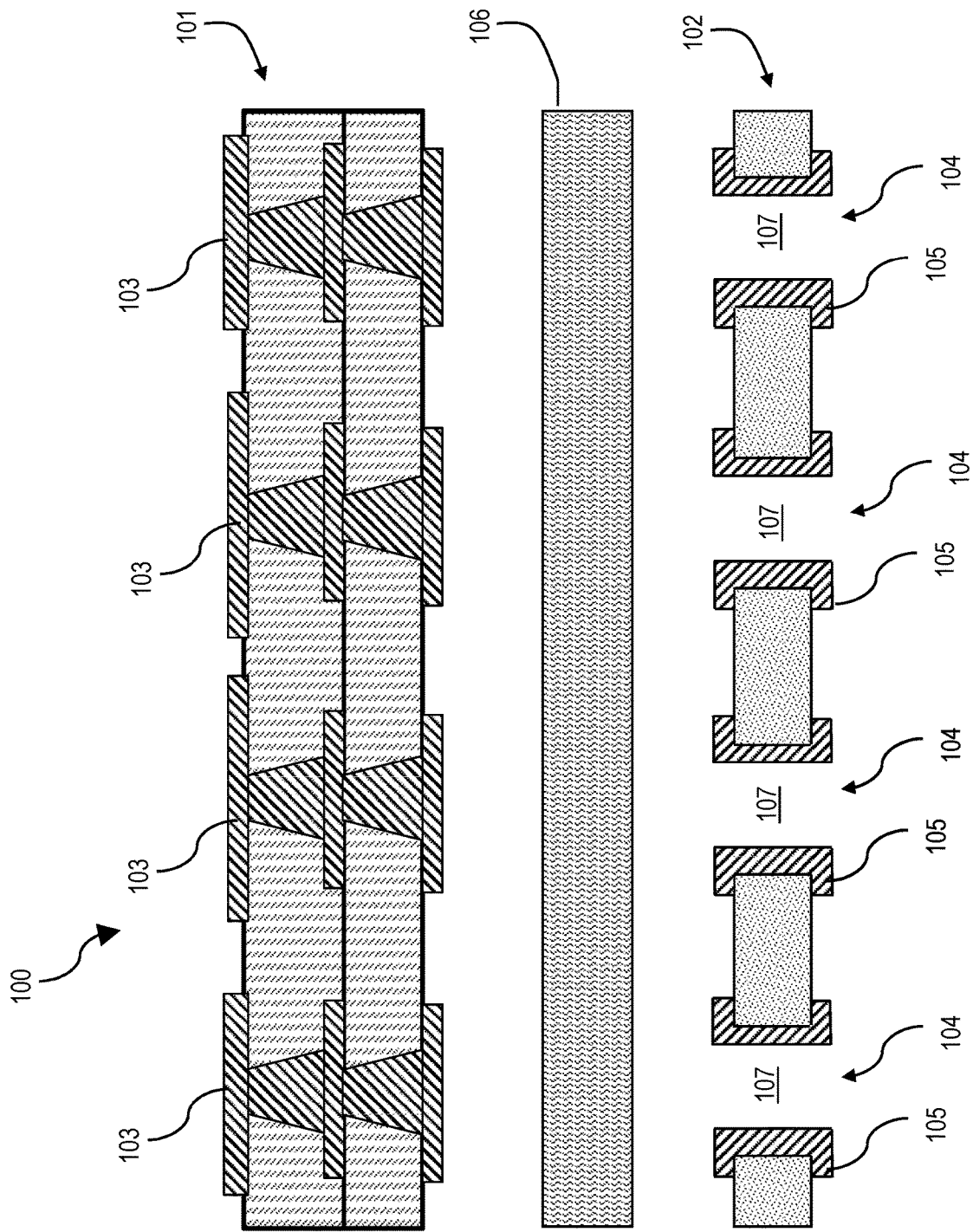
FIG. 1 depicts in an exploded schematic view an assembly that includes a top circuit substrate, an adhesive layer, and a ceramic stiffener, according to an exemplary embodiment.

According to one or more embodiments, the assembly and connections are realized by forming special structures on the ceramic bottom circuit assembly, which allows connections during the assembling process. As shown in FIG. 1, in an exemplary assembly 100 a top circuit substrate 101 and a bottom circuit assembly 102 are fabricated separately. The top circuit substrate 101 includes upper vias 103. In one or more embodiments, the upper vias 103 are solid vias. In one or more embodiments, the top circuit substrate 101 also includes a plurality of internal connections and may comprise heterogeneous patches that form different functional regions (not shown in detail).

According to one or more embodiments of the present invention, as shown in FIG. 1, an array of openings 104 are pre-fabricated in the bottom circuit assembly 102. According to some embodiments, the openings 104 are formed without drilling. According to at least one embodiment of the present invention, the openings 104 are circular in shape. In one or more embodiments, the openings 104 are plated with conductive material 105 to form lower vias 107, which are open, hollow vias.

Figure 2:
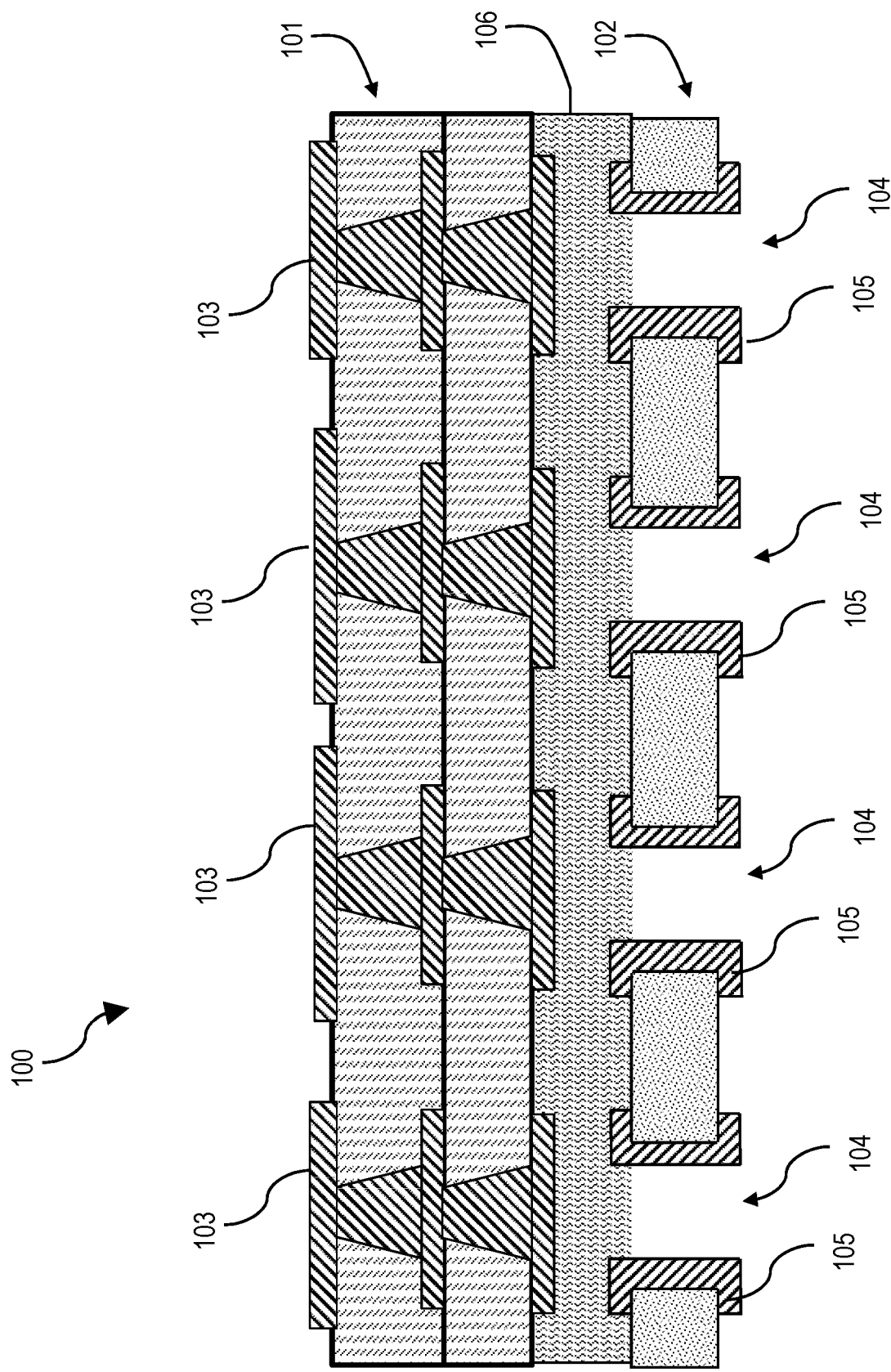
FIG. 2 depicts in a schematic view the assembly of FIG. 1 in an assembled state.
Figure 3:
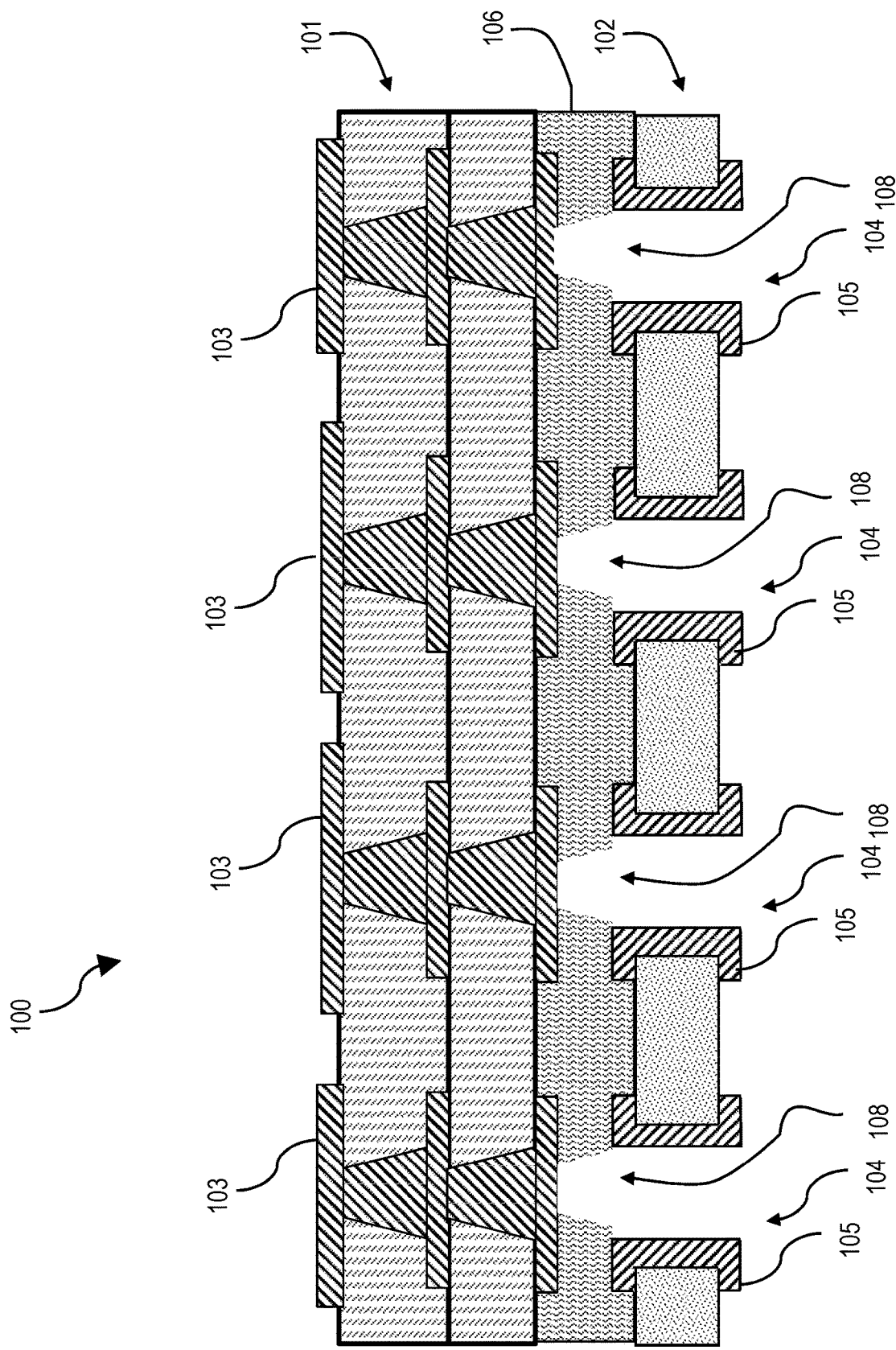
FIG. 3 depicts in a schematic view the assembly of FIGS. 1 and 2 after material removal to form holes through the adhesive layer.
Figure 4:
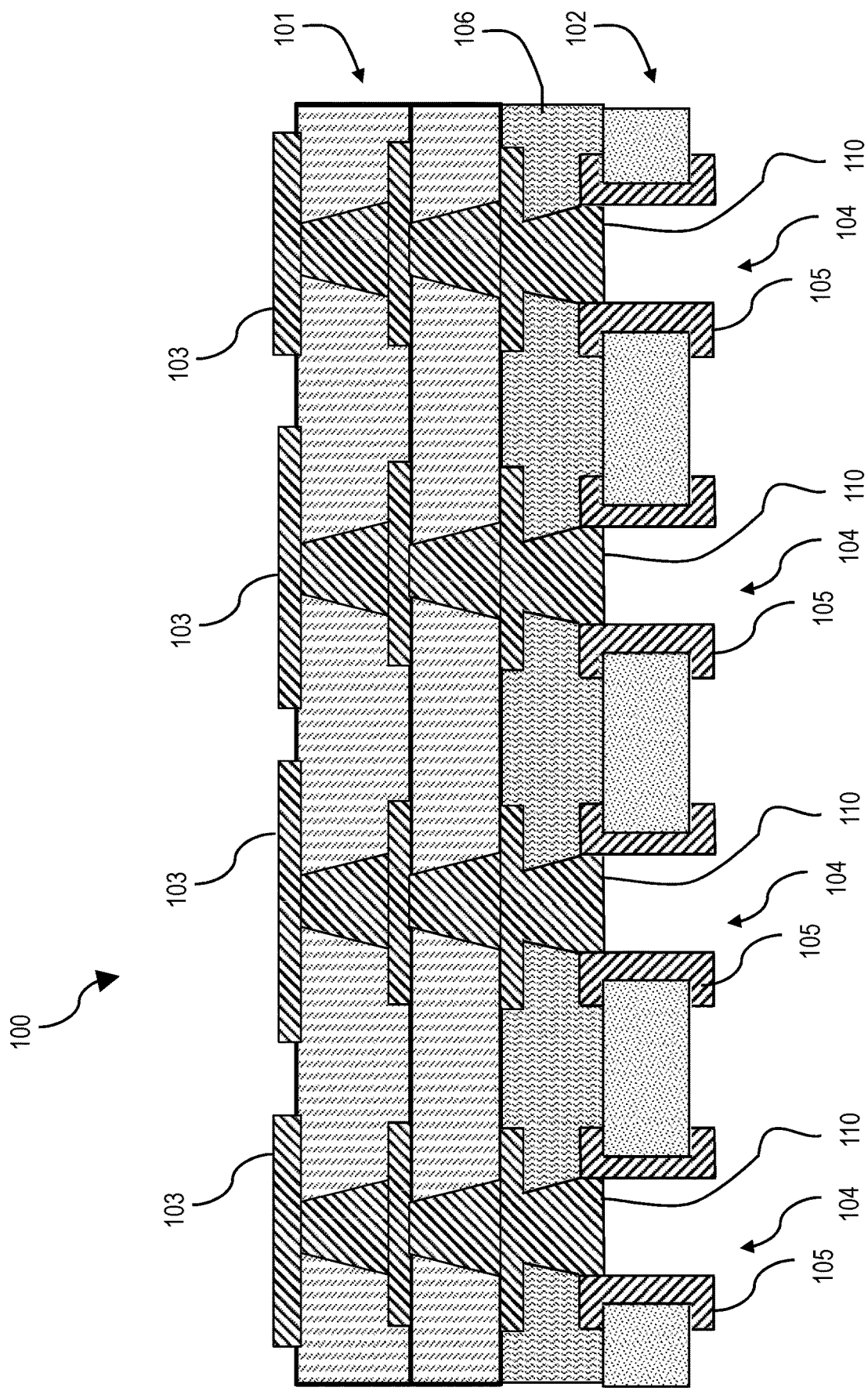
FIG. 4 depicts in a schematic view the assembly of FIGS. 1-3 after metal deposition to extend vias through the adhesive layer.

According to at least one embodiment of the present invention, the two substrates 101, 102 are laminated together, as shown in FIG. 2, with an adhesive layer 106, e.g., a fiber-resin prepreg layer, disposed between the substrates 101, 102. According to some embodiments, the adhesive layer 106 is solidified with heat and pressure. Exemplary ranges of heat and pressure will be apparent to the ordinary skilled worker. The substrates 101, 102 are laminated with the openings 104 aligned to the upper vias 103. According to at least one embodiment, through holes 108 then are formed in the adhesive layer 106, as shown in FIG. 3, by removing the solidified prepreg through the openings 104 of the bottom circuit assembly 102. According to some embodiments, the through holes 108 can be formed by laser drilling, photo lifting, plasma ashing, or the like. According to at least one embodiment of the present invention, the through holes 108 are electrically plated, as shown in FIG. 4, to form internal connections 110. Thus, the two substrates 101, 102 are combined together with mechanical stability and electrical connections.

It should be understood that laser drilling exploits the melt ejection material removal mechanism. Lasers of the kind suitable for forming through holes 108 in the adhesive layer 106 can use short pulses of ultraviolet (UV) or long wavelength infrared (IR) to achieve holes as small as about 50 microns. Similarly, it should be understood that photo lifting includes methods of patterning a target material on the surface of a substrate (e.g., a wafer) using a sacrificial material (e.g., a light sensitive coating or photoresist). Furthermore, it should be understood that plasma ashing includes methods of removing a photoresist from an etched substrate. According to one or more embodiments of the present invention, these and other methods can be used to form the through holes 108.

Figure 5:
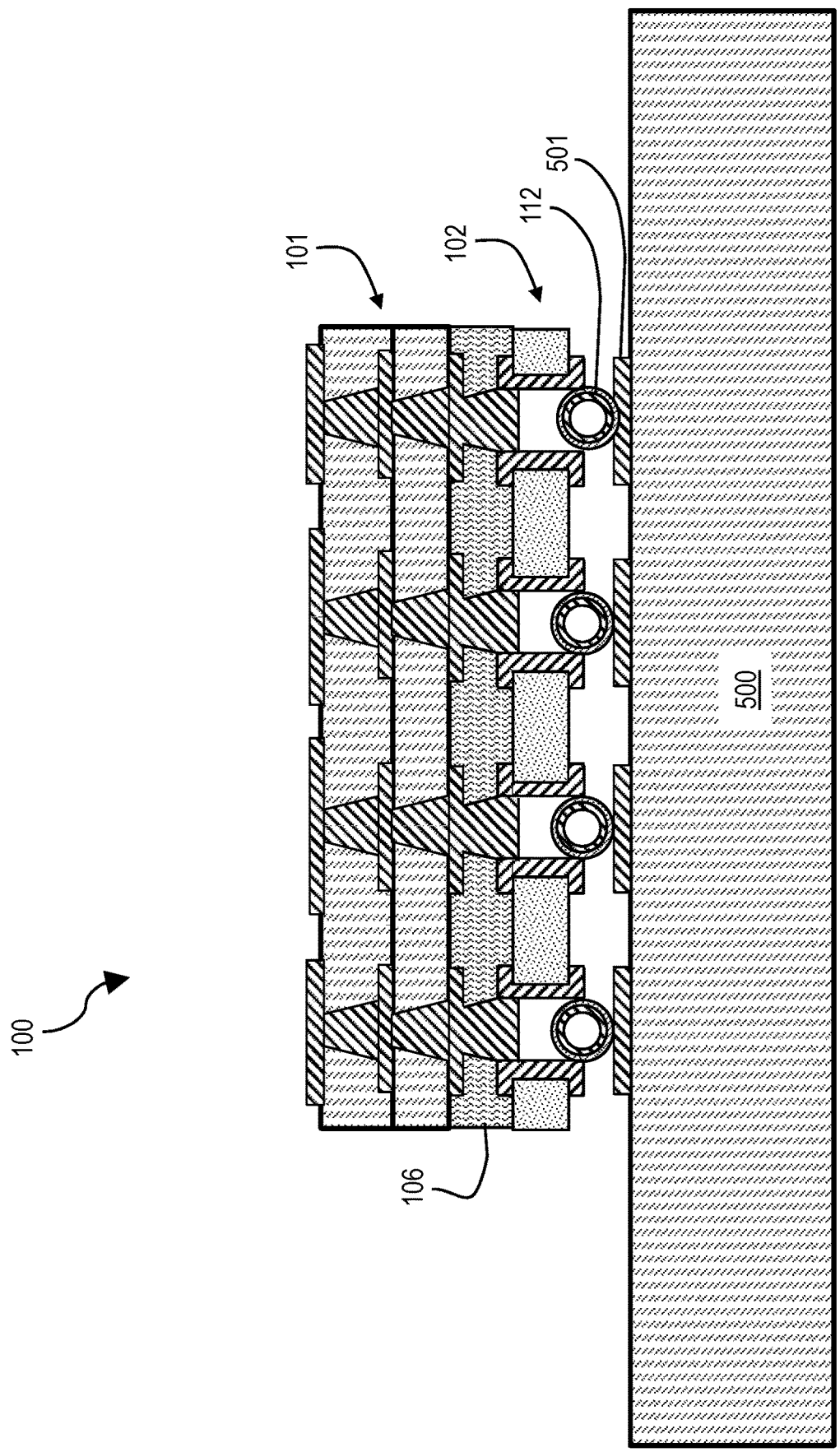
FIG. 5 depicts in a schematic view the assembly of FIGS. 1-4 assembled to a substrate by LGA balls or the like, according to an exemplary embodiment.

According to at least one embodiment, when a ceramic substrate is used as the bottom circuit assembly 102, flatness may be improved and electrical noise may be reduced. According to some embodiments, the amount of capacitance for electrical noise reduction is determined by the dielectric constant, layer thickness, and layer count. For example, a multi-layer ceramic structure may provide enhanced power decoupling because high dielectric constant materials can be used in combination with conventional ceramic materials as a compromise between mechanical stability of the conventional ceramics and higher capacitance of the high dielectric constant material. The multi-layer ceramic structure accordingly can be thinner than a single layer ceramic structure using only conventional ceramics or using only high dielectric constant material. In addition, the openings 104 (lower vias 107) can be used for "LGA-like" contacts onto a printed circuit board (PCB). Conductive balls 112 of proper size may be dropped or otherwise inserted into the openings 104, as shown in FIG. 5. The balls 112 may be either larger than the form holes as shown in FIG. 5, or smaller by sitting in large and shallow form holes. In either case, the balls should protrude beyond the lower surface of the bottom circuit assembly 102. Then, the substrate may be assembled onto a PCB 500 with fixtures, e.g., 501. Compared to conventional LGA socket technology, a contact solution according to embodiments of the present invention provides quality electrical connections (low inductance) at low cost.

According to some embodiments, to ensure all contacts fall into place, deformable materials may be used for the conductive balls 112, such as metal coated polymer.

Thus, one or more exemplary embodiments provide an innovative stiffener and attaching processes, which provides mechanical stability to a circuit substrate and also enables ultra-low inductance (e.g., at least 2 times lower inductance than conventional LGA contact pins connection) land grid array-like interconnections as well as distributed capacitance for effective power decoupling.

In one or more embodiments, a targeted application is embedded High Density Film (eHDF), where a stainless steel stiffener conventionally has been used and laminated in the substrate to meet flatness specifications. Compared to the conventional stainless steel, a ceramic stiffener according to at least one embodiment of the present invention provides improved flatness and a lower CTE to match the silicon chip (top circuit substrate) that is attached to a top surface of the stiffener. Meanwhile, the relatively high dielectric constant (ranging from about 1,000 to 10,000) provides power decoupling. Furthermore, indented structures at the bottom of the stiffener provide LGA-like connectivity from the silicon chip through the stiffener to an underlying PCB. Thus, embodiments address mechanical needs for stiffening a circuit assembly, and also provide a new solution for heterogeneous 3D (three dimensional) circuit integration.

Further regarding certain advantages of select embodiments for circuit integration, in order to stack two substrates together and establish vertical connections, conventionally, plated through hole vias have been required to drill through the entire stacking assembly. However, ceramic substrates are not readily drilled, and plated through holes may introduce "via-stub" resonances that can cause signal distortions. In one or more embodiments, forming solid vias in the top substrate 101 and in the adhesive layer 106, while having open vias in the bottom circuit assembly 102 obviates the via-stub resonance problem.

Figure 6:
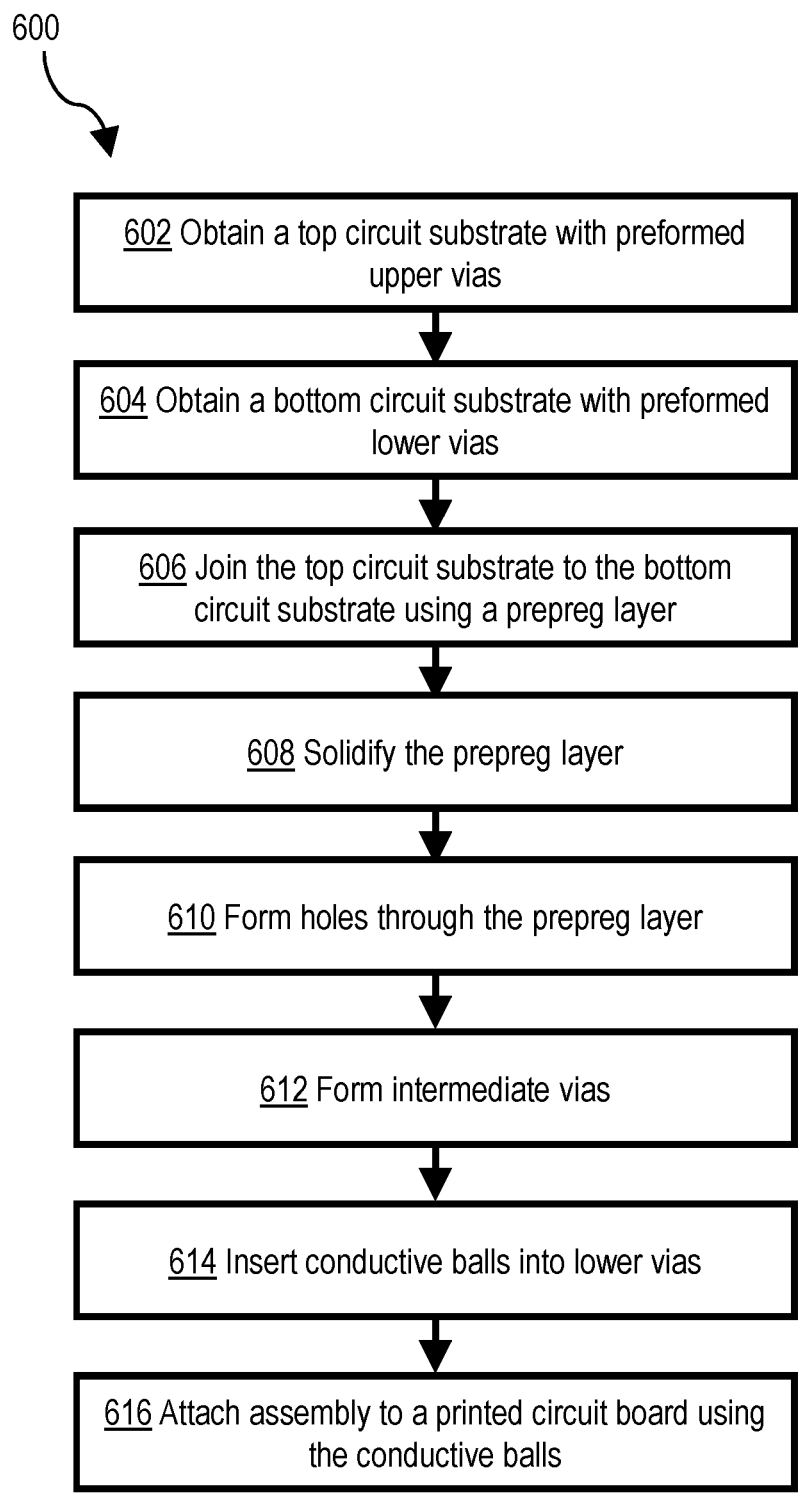
FIG. 6 is a flow diagram of a method of connecting a circuit assembly to a printed circuit board, according to an exemplary embodiment.

Thus, it will be appreciated that an exemplary method 600, as shown in FIG. 6, and with reference to the components illustrated in FIGS. 1-5, includes the following steps. At 602, obtain a top circuit substrate 101 with preformed upper vias 103. At 604, obtain a bottom circuit assembly 102 with preformed lower vias 107. At 606, join the top circuit substrate 101 to the bottom circuit assembly 102 with the upper vias 103 aligned to the lower vias 107, using an adhesive layer 106. At 608, solidify the adhesive layer 106 using heat and pressure. At 610, form holes 108 through the adhesive layer 106 by using laser drilling, plasma ashing, photo lifting, or the like to remove material from the adhesive layer 106. At 612, form internal connections 110 by plating the through holes 108 with conductive material to electrically connect the upper vias 103 to the lower vias 107. At 614, drop or otherwise insert conductive balls 112 into the lower vias 107. At 616, attach the assembly 100 to a printed circuit board 500 using the conductive balls 112.

Recapitulation

Given the discussion thus far, and with reference to the accompanying drawings, it will be appreciated that, in general terms, an exemplary assembly 100, according to an aspect of the invention, includes a top circuit substrate 101; an adhesive layer 106 that underlays the top circuit substrate; and a bottom circuit assembly 102 that underlays the adhesive layer and is attached to the top circuit substrate by the adhesive layer as a stiffener.

In one or more embodiments, the bottom circuit assembly has an elastic modulus at least two times greater than an elastic modulus of the top circuit substrate. In one or more embodiments, the bottom circuit assembly has an elastic modulus at least six times greater than an elastic modulus of the top circuit substrate. In one or more embodiments, the bottom circuit assembly is a ceramic structure.

In one or more embodiments, the ceramic structure comprises a material with dielectric constant greater than the dielectric constant of aluminum oxide. In one or more embodiments, the ceramic structure comprises barium strontium titanate.

In one or more embodiments, the assembly also includes a plurality of upper vias that extend through the top circuit substrate, a plurality of lower vias that extend through the bottom circuit assembly, and a plurality of holes that extend through the adhesive layer in registry with the upper vias and the lower vias internal connections.

In one or more embodiments, the assembly also includes metal deposited in the plurality of holes to form a plurality of internal connections that extend through the adhesive layer and connect the upper vias in electrical communication with the lower vias.

In one or more embodiments, the assembly also includes a plurality of conductive balls that are positioned in the lower vias, wherein the plurality of conductive balls electrically and mechanically connect the assembly to a printed circuit board that underlays the bottom circuit assembly.

In one or more embodiments, the top circuit substrate comprises a plurality of heterogeneous patches that form dedicated functional regions.

According to another aspect, an exemplary method 600 for forming a circuit assembly includes at 602 obtaining a top circuit substrate with preformed upper vias, at 604 obtaining a bottom circuit assembly with preformed lower vias, at 606 joining the top circuit substrate to the bottom circuit assembly with the upper vias aligned to the lower vias, using an adhesive layer, and at 608 solidifying the adhesive layer using heat and pressure.

In one or more embodiments, the method also includes forming holes through the adhesive layer. In one or more embodiments, the holes through the adhesive layer are formed by laser drilling. In one or more embodiments, the holes through the adhesive layer are formed by photo lifting. In one or more embodiments, the holes through the adhesive layer are formed by plasma ashing.

In one or more embodiments, the method also includes forming internal connections that electrically connect the upper vias to the lower vias, by plating the holes through the adhesive layer with conductive material.

In one or more embodiments, the method also includes inserting conductive balls into the lower vias of the circuit assembly. In one or more embodiments, the method also includes attaching the circuit assembly to a printed circuit board using the conductive balls.

In another aspect, an exemplary assembly 100 includes a top circuit substrate 101; a bottom circuit assembly 102 that underlays the top circuit substrate and is attached to the top circuit substrate by an adhesive layer 106 as a stiffener, the adhesive layer, and a plurality of conductive balls 112. The top circuit substrate includes a plurality of upper vias 103 that extend through the top circuit substrate. The bottom circuit assembly includes a plurality of lower vias 107 that extend through the bottom circuit assembly. The adhesive layer includes internal connections 110 that electrically connect the upper vias to the lower vias. The conductive balls are housed in the lower vias. The bottom circuit assembly has an elastic modulus at least six times the elastic modulus of the top circuit substrate, and has a coefficient of thermal expansion at least two times the coefficient of thermal expansion of the top circuit substrate.

In one or more embodiments, the bottom circuit assembly has a coefficient of thermal expansion no more than four times the coefficient of thermal expansion of the top circuit substrate.

The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. An assembly comprising:
   a top circuit substrate;
   an adhesive layer that underlays the top circuit substrate, the adhesive layer having a first opening, wherein a portion of the adhesive layer exposed by the first opening is plated with a first conductive material; and
   a bottom circuit assembly that underlays the adhesive layer and is attached to the top circuit substrate by the adhesive layer, wherein the bottom circuit assembly is a stiffener of the top circuit substrate, wherein the bottom circuit assembly comprises:
   a first ceramic layer comprising aluminum oxide;
   a second ceramic layer having a dielectric constant greater than that of the first ceramic layer; and
   a second opening, wherein a portion of the bottom circuit assembly exposed by the second opening is plated with a second conductive material,
   wherein the first conductive material contacts the second conductive material.

2. The assembly of claim 1, wherein the bottom circuit assembly has an elastic modulus at least two times greater than an elastic modulus of the top circuit substrate.

3. The assembly of claim 1, wherein the bottom circuit assembly has an elastic modulus at least six times greater than an elastic modulus of the top circuit substrate.

4. The assembly of claim 1, wherein the bottom circuit assembly is a multi-layer ceramic structure that provides parallel-plate capacitance power decoupling the top circuit substrate from a printed circuit board underlaying the bottom circuit assembly.

5. The assembly of claim 1, wherein the second ceramic layer comprises barium strontium titanate.

6. The assembly of claim 1, further comprising a plurality of upper vias that extend through the top circuit substrate, a plurality of lower vias that extend through the bottom circuit assembly, and a plurality of holes that extend through the adhesive layer in registry with the upper vias and the lower vias.

7. The assembly of claim 6, further comprising metal deposited in the plurality of holes to form a plurality of internal connections that extend through the adhesive layer and connect the upper vias in electrical communication with the lower vias.

8. The assembly of claim 7, further comprising a plurality of conductive balls that are positioned in the lower vias, not contacting the first conductive material of the adhesive layer, wherein the plurality of conductive balls electrically and mechanically connect the assembly to a printed circuit board that underlays the bottom circuit assembly.

9. The assembly of claim 1, wherein the top circuit substrate comprises a plurality of heterogeneous patches that form dedicated functional regions.

10. The assembly of claim 1, wherein the first and second conductive materials are a same conductive material.

11. A method for forming a circuit assembly, the method comprising:
   obtaining a top circuit substrate with preformed upper vias;
   obtaining a bottom circuit assembly with preformed lower vias, wherein the bottom circuit assembly comprises a first ceramic layer comprising aluminum oxide and a second ceramic layer comprising a material that has a dielectric constant greater than that of aluminum oxide;
   joining the top circuit substrate to the bottom circuit assembly with the upper vias aligned to the lower vias, using an adhesive layer;
   solidifying the adhesive layer using heat and pressure; and
   forming holes through the adhesive layer by photo lifting.

12. The method of claim 11, further comprising: forming internal connections that electrically connect the upper vias to the lower vias, by plating the holes through the adhesive layer with conductive material.

13. The method of claim 12, further comprising: completing the circuit assembly by inserting conductive balls into the lower vias.

14. The method of claim 13, further comprising: attaching the completed circuit assembly to a printed circuit board using the conductive balls.

15. An assembly comprising:
   a top circuit substrate that includes a plurality of upper vias that extend through the top circuit substrate, wherein a first conductive material fills the upper vias;
   a bottom circuit assembly that underlays the top circuit substrate, includes a plurality of lower vias that extend through the bottom circuit assembly, and is attached to the top circuit substrate by an adhesive layer, wherein the bottom circuit assembly comprises a first ceramic layer comprising aluminum oxide and a second ceramic layer comprising a material that has a dielectric constant greater than that of aluminum oxide, wherein a second conductive material plates inner surfaces of the lower vias, and the bottom circuit assembly acts as a stiffener of the top circuit substrate;
   the adhesive layer that includes a plurality of internal openings filled with a third conductive material that electrically connects the upper vias to the lower vias by contacting the first conductive material of the upper vias and the second conductive material of the lower vias; and
   a plurality of conductive balls housed in the lower vias, not contacting the third conductive material of the adhesive layer.

16. The assembly of claim 15, wherein the bottom circuit assembly has a coefficient of thermal expansion no more than twice the coefficient of thermal expansion of the top circuit substrate.

17. The assembly of claim 15, wherein the first, second, and third conductive materials are a same conductive material.

* * * * *